United States Patent
Yun et al.

(10) Patent No.: US 12,046,315 B2
(45) Date of Patent: Jul. 23, 2024

(54) MEMORY BUILT-IN SELF-TEST WITH AUTOMATED REFERENCE TRIM FEEDBACK FOR MEMORY SENSING

(71) Applicant: Siemens Industry Software Inc., Plano, TX (US)

(72) Inventors: Jongsin Yun, Portland, OR (US); Benoit Nadeau-Dostie, Gatineau (CA); Martin Keim, Sherwood, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/756,963

(22) PCT Filed: May 28, 2020

(86) PCT No.: PCT/US2020/034860
§ 371 (c)(1),
(2) Date: Jun. 7, 2022

(87) PCT Pub. No.: WO2021/118634
PCT Pub. Date: Jun. 17, 2021

(65) Prior Publication Data
US 2024/0013846 A1    Jan. 11, 2024

Related U.S. Application Data

(60) Provisional application No. 62/945,335, filed on Dec. 9, 2019.

(51) Int. Cl.
*G11C 29/14*   (2006.01)
*G11C 29/12*   (2006.01)
*G11C 29/46*   (2006.01)

(52) U.S. Cl.
CPC .......... *G11C 29/14* (2013.01); *G11C 29/1201* (2013.01); *G11C 29/46* (2013.01)

(58) Field of Classification Search
None
See application file for complete search history.

(56) References Cited

U.S. PATENT DOCUMENTS

| | | | | |
|---|---|---|---|---|
| 8,508,975 | B2 * | 8/2013 | Toba | G11C 17/165 365/63 |
| 9,042,166 | B2 * | 5/2015 | Toko | H10N 50/01 365/158 |

(Continued)

OTHER PUBLICATIONS

PCT International Search Report and Written Opinion of International Searching Authority mailed Oct. 5, 2020 corresponding to PCT International Application No. PCT/US2020/034860 filed May 28, 2020.

*Primary Examiner* — Tan T. Nguyen

(57) ABSTRACT

This application discloses a memory built-in self-test system to prompt a memory device to sense values of stored data using a reference trim during memory read operations. The memory built-in self-test system can automatically set the reference trim for the memory device. The memory built-in self-test system includes a memory built-in self-test controller to prompt the memory device to perform the memory read operations with different test values for the reference trim. The memory built-in self-test system also includes a trim feedback circuit to determine when the memory device fails to correctly sense the values of the stored data using the test values for the reference trim, and set the reference trim for the memory device based, at least in part, on the failures of the memory device to correctly sense the stored data.

11 Claims, 7 Drawing Sheets

(56) References Cited

U.S. PATENT DOCUMENTS

| | | |
|---|---|---|
| 2009/0109756 A1* | 4/2009 | Aritome ................ G11C 16/10 365/185.11 |
| 2013/0173970 A1 | 7/2013 | Kleveland et al. |
| 2015/0124515 A1 | 5/2015 | Jung et al. |
| 2015/0127883 A1 | 5/2015 | Chen et al. |
| 2017/0186472 A1 | 6/2017 | Jan et al. |
| 2019/0115091 A1 | 4/2019 | Seok et al. |
| 2019/0189202 A1 | 6/2019 | Avraham et al. |
| 2019/0252033 A1 | 8/2019 | Regulapati et al. |
| 2019/0355426 A1 | 11/2019 | Sheperek et al. |

* cited by examiner

EXAMPLE AUTOMATED TRIM VALUE SEARCH USING FAILURE TAILS

EXAMPLE AUTOMATED TRIM VALUE SEARCH USING FAILURE CLIFFS

MEMORY BUILT-IN SELF-TEST WITH AUTOMATED REFERENCE TRIM FEEDBACK FOR MEMORY SENSING

RELATED APPLICATION

This patent application claims priority to U.S. Provisional Patent Application No. 62/945,335, filed Dec. 9, 2019, which is incorporated by reference herein.

TECHNICAL FIELD

This application is generally related to electronic design automation and, more specifically, to built-in self-test with automated reference trim feedback for memory sensing.

BACKGROUND

Magnetoresistive Random Access Memory (MRAM) has become an attractive non-volatile memory solution due to its small size, fast operation speed, and good endurance. MRAM devices can store data in magnetic domains, for example, as a spin polarity of magnets in their free layers. A MRAM device can write data in a magnetic domain by setting the spin polarity of magnets in its free layer, for example, providing a spin-polarized current through Magnetic Tunnel Junction (MTJ), which exerts torque on local magnetization in the free layer, often called Spin Torque Transfer (STT).

To read the stored data, the MRAM device can ascertain the spin polarity of the magnets in its free layer relative to a pinned reference layer underneath the corresponding free layer. When the spin polarity is parallel to the pinned reference layer, a resistivity on a reference bit-line (BL) of the MRAM device can be deemed low and thus correspond to a data "0" value. When the spin polarity is perpendicular or anti-parallel to the pinned reference layer, the resistivity on the reference bit-line of the MRAM device can be deemed high and thus correspond to a data "1" value. The MRAM device can include sensing circuitry to detect the resistivity on the reference bit-line of the MRAM device and compare the detected resistivity against a reference resistance to determine whether to deem the detected resistivity as low corresponding to a data "0" value or as high corresponding to a data "1" value.

Many MRAM devices have relatively small resistivity separation between a high resistive state associated with a data "1" value and a low resistive state associated with a data "0" value, which can render reliable data read operations a challenge. To combat this lack of resistivity separation, some MRAM devices have included trim circuitry to adjust the reference resistance used by the MRAM devices to differentiate between high resistive states and low resistive states of its memory cells. The trim circuitry can receive an external input corresponding to a reference trim, for example, from test engineers, which can adjust the reference resistance that the MRAM devices compares against the resistance values read from its memory cells in order to determine whether the memory cells stored data "1" values or data "0" values. Test engineers typically determine values for reference trims in MRAM devices through extensive testing over different environmental conditions, such as temperature variations, to identify a full distribution of bit properties for the MRAM device before performing engineering analysis to identify the reference trims. This MRAM device testing has proven costly or impractical in larger MRAM implementations.

SUMMARY

This application discloses a memory built-in self-test system to prompt a memory device to sense values of stored data using a reference trim during memory read operations. The memory built-in self-test system can automatically set the reference trim for the memory device. The memory built-in self-test system includes a memory built-in self-test controller to prompt the memory device to perform the memory read operations with different test values for the reference trim. The memory built-in self-test system also includes a trim feedback circuit to determine when the memory device fails to correctly sense the values of the stored data using the test values for the reference trim, and set the reference trim for the memory device based, at least in part, on the failures of the memory device to correctly sense the stored data. Embodiments will be described below in greater detail.

DETAILED DESCRIPTION

Memory Built-In Self-Test System with Automated Trim Feedback

Figure 1:
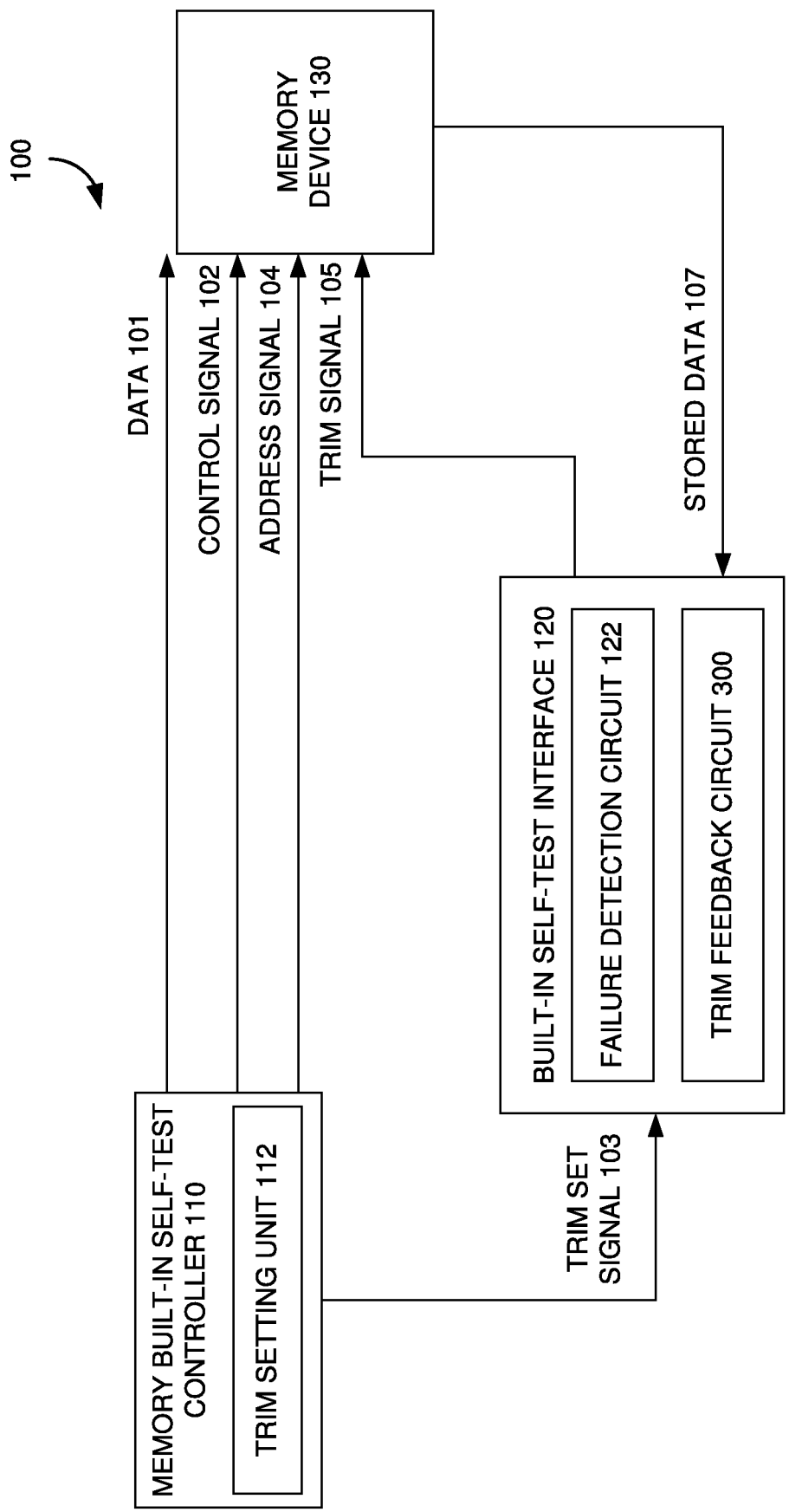
FIG. 1 illustrates an example memory system including a memory built-in self-test system with automated trim feedback according to various embodiments.

FIG. 1 illustrates an example memory system 100 including a memory built-in self-test with automated trim feedback according to various embodiments. Referring to FIG. 1, the memory system 100 includes a memory device 130 to store data 101 during data write operations and to output stored data 107 during data read operations. In some embodiments, the memory device 130 can include a Magnetoresistive Random Access Memory (MRAM) to store the data 101 in magnetic domains, for example, as a spin polarity of magnets in a free layer. The Magnetoresistive Random Access Memory can be a Spin Torque Transfer (STT) MRAM device, which can write the data 101 by providing a spin-polarized current through Magnetic Tunnel Junction (MTJ), which exerts torque on local magnetization in the free layer. In other embodiments, the memory device 130 can include other types of Random Access Memory (RAM), such as Dynamic Random Access Memory (DRAM), Static Random Access Memory (SRAM), or the like, or include other types of non-volatile memory, such as Flash memory, Resistive Random Access Memory (ReRAM), or the like.

The memory system 100 can include a memory built-in self-test controller 110 to control memory access operations of the memory device 130. The memory built-in self-test controller 110 can generate a control signal 102 and an address signal 104 that, when provided to the memory device 130, can prompt the memory device 130 to perform a memory access operation, such as a data write operation or a data read operation at an address indicated by the address signal 104. When the control signal 102 corresponds to a data write operation, the memory device 130 can store the data 101 from the memory built-in self-test controller 110 at the address indicated by the address signal 104 in response to the control signal 102. When the control signal 102 corresponds to a data read operation, the memory device 130 can locate and output the stored data 107 at the address indicated by the address signal 104 in response to the control signal 102. The memory device 130 can read the stored data 107 by sensing an electric value, such as voltage, current, resistance, or the like, associated with a bit line of the memory device 130, and comparing the sensed electrical value against a reference value to determine whether the stored data 107 corresponding to a high data value associated with data "1" or a low data value associated with data "0". In some embodiments, one or more intermediate data values between may exist between the high data value and the low data value.

Since, in some instances, the reference value utilized by the memory device 130 to sense the data value of the stored data 107 can be misaligned with the electrical characteristics of one or more of the memory cells in the memory device 130, the memory device 130 can adjust the reference value with a reference trim, for example, provided to the memory device 130 in a trim signal 105. The memory device 130 can utilize the adjusted reference value to determine whether the stored data 107 corresponds to a high data value or a low data value. An example of read characteristics of a magnetoresistive memory device using a reference trim value is described below with reference to FIG. 2.

Figure 2:
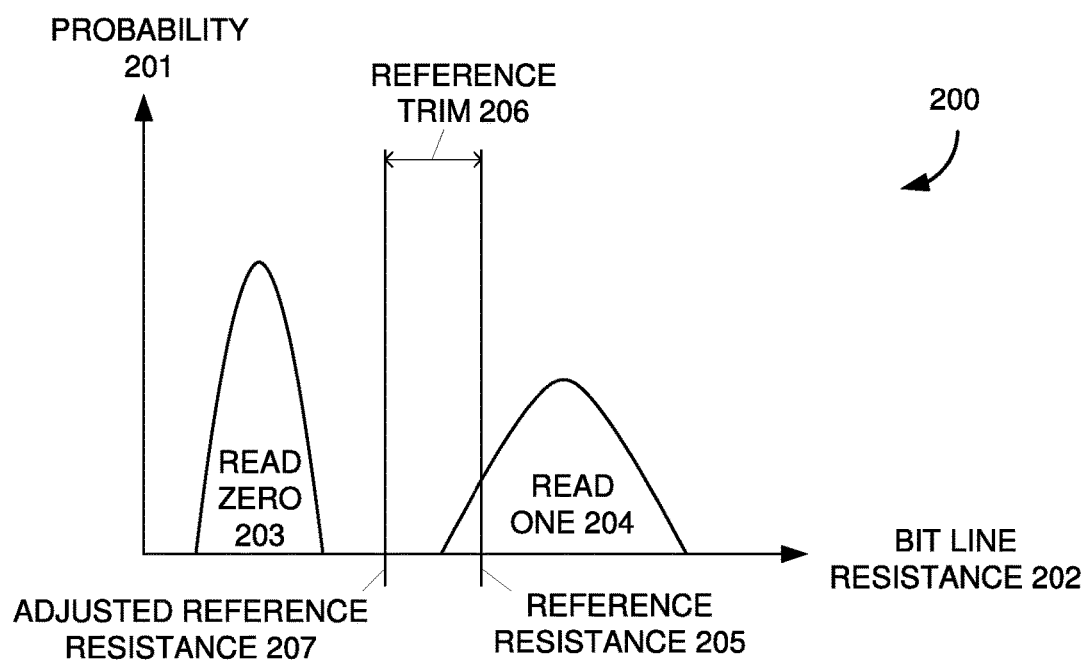
FIG. 2 illustrates a graph of example read characteristics of a magnetoresistive memory device according to various embodiments.

FIG. 2 illustrates a graph 200 of example read characteristics of a magnetoresistive memory device according to various embodiments. Referring to FIG. 2, the graph 200 has an x-axis corresponding to bit line resistances 202 during read operations of the magnetoresistive memory device and has a y-axis corresponding to a probability 201 or likelihood of occurrence for each of the bit line resistances 202. In this example, the read characteristics can include two groupings, one for bit line resistances associated with reading a stored data "0" value or read zero 203 and another for bit line resistances associated with reading a stored data "1" value or read one 204.

The magnetoresistive memory device also can include a reference resistance 205 value that can be utilized to determine whether a sensed bit line resistance value corresponds to a stored data "0" value or a stored data "1" value stored in the magnetoresistive memory device. In the instant example, the reference resistance 205 falls within a range corresponding to bit line resistances associated with reading a stored data "1" value or read one 204, meaning the magnetoresistive memory device could sense a resistance of a stored data "1" value and use the reference resistance 205 to incorrectly associate it with a stored data "0" value. In some instances, the magnetoresistive memory device can adjust the reference resistance 205 using a reference trim 206 to generate an adjusted reference resistance 207, which can be located between the read zero 203 and the read one 204 characteristics of the magnetoresistive memory device.

Referring back to FIG. 1, the memory system 100 can include a built-in self-test interface 120 to generate the trim signal 105 having a value for the reference trim. In some embodiments, the value for the reference trim can correspond to a resistance value, a voltage value, a current value, or the like, to adjust a reference resistance, a reference voltage, a reference current, respectively. The built-in self-test interface 120 can provide the trim signal 105 to the memory device 130, which can utilize the value of the reference trim in the trim signal 105 to adjust the reference value used to read the stored data 107.

The built-in self-test interface 120 can automatically set the value for the reference trim that the memory device 130 can utilize to read the stored data 107. In some embodiments, the built-in self-test interface 120 can set the value of the reference trim using an automated trim feedback process, for example, by receiving known test data values stored in the memory device 130 that were read with different values for the reference trim and then setting the value for the reference trim based on the results of reading the known test data values.

The memory built-in self-test controller 110 can include a trim setting unit 112 to initiate the automated trim feedback process, which allows the built-in self-test interface 120 to set a value for the reference trim of the memory device 130. The trim setting unit 112 can write test data, such as the data 101, to the memory device 130, for example, by generating the control signal 102 and the address signal 104 to prompt the memory device 130 to perform data write operations with the data 101. In some embodiments, the trim setting unit 112 can write the same data value to memory cells in the memory device 130, such as a data "1" or a data "0".

The trim setting unit 112 can generate a trim set signal 103 to prompt the built-in self-test interface 120 to select a value for the reference trim and provide the selected value to the memory device 130 in a trim signal 105. The trim setting unit 112 can prompt the memory device 130 to perform data read operations and output the test data, such as the stored data 107, using the value for the reference trim in the trim signal 105.

The built-in self-test interface 120 can include a failure detection circuit 122 to determine when the memory device 130 fails to output the stored data 107 with the same value as the data 101. In some embodiments, the failure detection circuit 122 can compare the stored data 107 read from the memory device 130 to a type of the test data, such as a data "1" value or a data "0" value, and detect failures by the memory device 130 to output the stored data 107 with the correct value based on the comparison.

The built-in self-test interface 120 can include a trim feedback circuit 300 to utilize the failures detected by the failure detection circuit 122 to select a different value for the reference trim during a subsequent read of the test data from the memory device 130. The trim feedback circuit 300 can generate a trim signal 105 with the selected value for the reference trim for use in a subsequent read of the test data from the memory device 130. The trim setting unit 112 and the built-in self-test interface 120 can iterate the process of selecting reference trim values and reading the test data from the memory until the trim feedback circuit 300 identifies a reference trim setting for the type of test data. In some embodiments, the trim setting unit 112 can select a new type of the data 101 to store to the memory and initiate the automated feedback process to identify a reference trim setting for the new type of the data. The trim feedback circuit 300 can set the value for the reference trim using the identified reference trim settings for the types of test data, for example, aggregating the reference trim settings. Embodiments of the trim feedback circuit 300 will be described in greater detail below with reference to FIG. 3.

Figure 3:
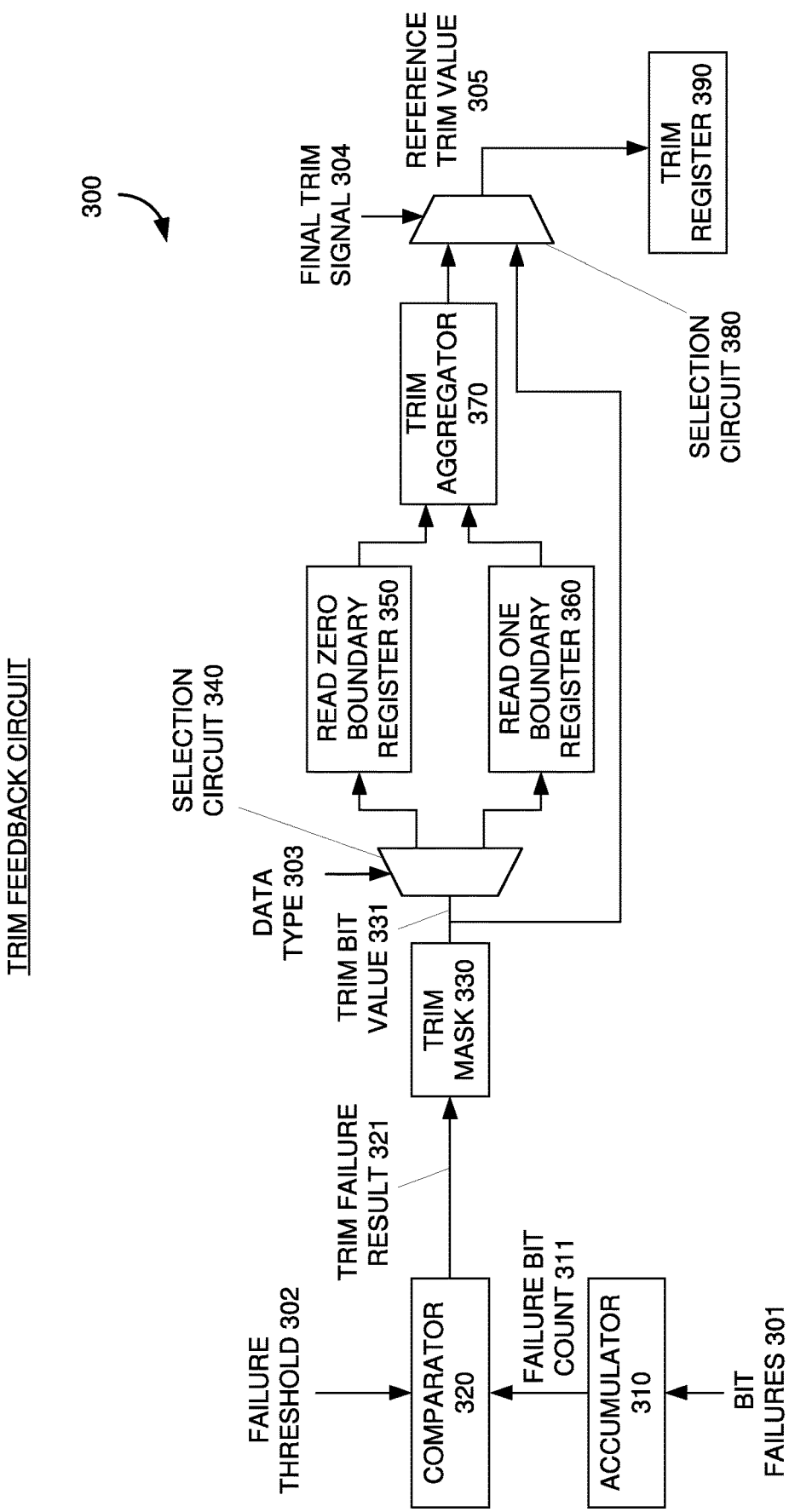
FIG. 3 illustrates an example trim feedback circuit to implement an automated trim feedback process according to various embodiments.

FIG. 3 illustrates an example trim feedback circuit 300 to implement an automated trim feedback process according to various embodiments. Referring to FIG. 3, the trim feedback circuit 300 can include an accumulator 310 to receive bit failures 301, for example, from a failure detection circuit 122 shown in FIG. 1. Each of the bit failures 301 can correspond to a bit of data that was misread from a memory device using a particular reference trim value. For example, when the data having a value of "0" was read from a memory device as having a value of "1", the bit failure 301 for that data can be provided the accumulator 310. The accumulator 310 can add the bit failures 301 associated with data reads using a particular reference trim, which generates the failure bit count 311. An example of failure characteristics of a magnetoresistive memory device for various reference trim values is described below with reference to FIG. 4A.

Figure 4A:
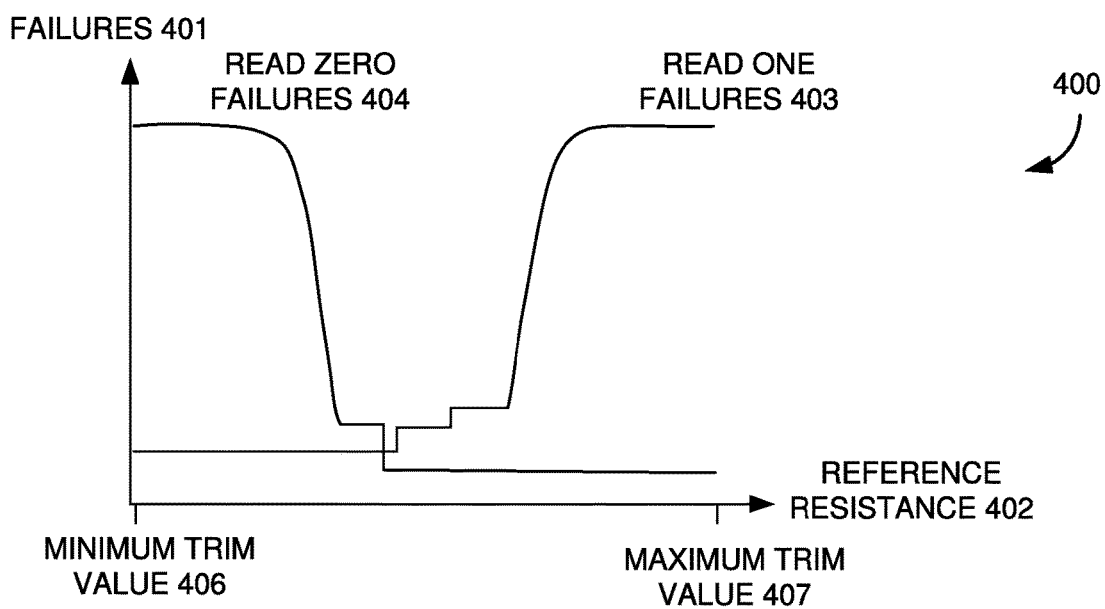
FIG. 4A illustrates a graph of example memory device failures at different sensing reference values according to various embodiments.

FIG. 4A illustrates a graph of example memory device failures at different sensing reference values according to various embodiments. Referring to FIG. 4A, the graph 400 has an x-axis corresponding to reference resistances 402 used by magnetoresistive memory device during read operations and has a y-axis corresponding to accumulated failures 401 of read operations using the various reference resistances 402. The reference resistances 402 can range between the minimum trim value 406 and the maximum trim value 407, which correspond to a lowest value of the reference trim and a highest value of the reference trim, respectively.

In the instant example, the magnetoresistive memory device can have an array of memory cells, one or more of which may fail regardless of the value of the reference trim. For instance, when one or more failures in the magnetoresistive memory device corresponds to read zero failures, the accumulated failures 401 may not reached to zero at the maximum trim value 407. The accumulated failures 401 at the maximum trim value 407, in some embodiments, can correspond to a baseline read zero fail count present regardless of the reference trim value. Since the read zero failures at the maximum trim value 407 can correspond to minimum level of read zero failures regardless of the reference trim value, the accumulated failures 401 at the maximum trim value 407 may not be considered when setting the reference trim value based on read zero failures.

When one or more failures in the magnetoresistive memory device corresponds to read one failures, the accumulated failures 401 may not reached to zero at the minimum trim value 406. The accumulated failures 401 at the minimum trim value 406, in some embodiments, can correspond to a baseline read one fail count present regardless of the reference trim value. Since the read one failures at the minimum trim value 406 can correspond to minimum level of read one failures regardless of the reference trim value, the accumulated failures 401 at the minimum trim value 406 may not be considered when setting the reference trim value based on read one failures.

In this example, the graph 400 shows read zero failures 404 and read one failures 403. The read zero failures 404 can correspond to a number of accumulated failures of the memory device to correctly read a data value of "0" using the various reference resistances. The read zero failures 404 show a high number of failures when the reference trim is closer to the minimum trim value 406, and a low number of failures when the reference trim is closer to the maximum trim value 407. The read one failures 403 can correspond to a number of accumulated failures of the memory device to correctly read a data value of "1" using the various reference resistances. The read one failures 403 show a lower number of failures when the reference trim is closer to the minimum trim value 406, and a higher number of failures when the reference trim is closer to the maximum trim value 407.

Referring back to FIG. 3, the trim feedback circuit 300 can include a comparator 320 to determine whether a number of failures for a reference trim value described by the failure bit count 311 exceed a failure threshold 302. The comparator 320 can generate a trim failure result 321 based on the comparison of the failure bit count 311 to the failure threshold 302. In some embodiments, the trim failure result 321 can identify whether the failure bit count 311 exceeds the failure threshold 302.

In some embodiments, the trim feedback circuit 300 can implement an automated trim value search using failure tails as the failure threshold 302. An example of automated trim value search using failure tails is described below with reference to FIG. 4B. In some embodiments, the trim feedback circuit 300 can implement an automated trim value search using failure cliffs as the failure threshold 302. An example of automated trim value search using failure cliffs is described below with reference to FIG. 4C.

Figure 4B:
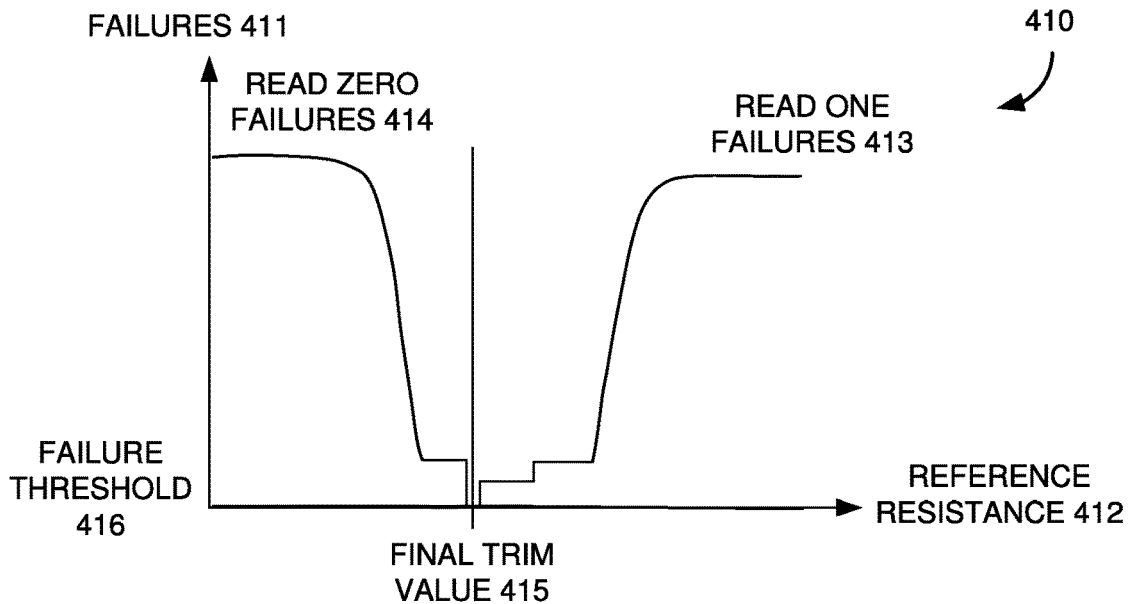
FIGS. 4B and 4C illustrate graphs of example trim reference selection results using different failure thresholds according to various embodiments.
Figure 4C:
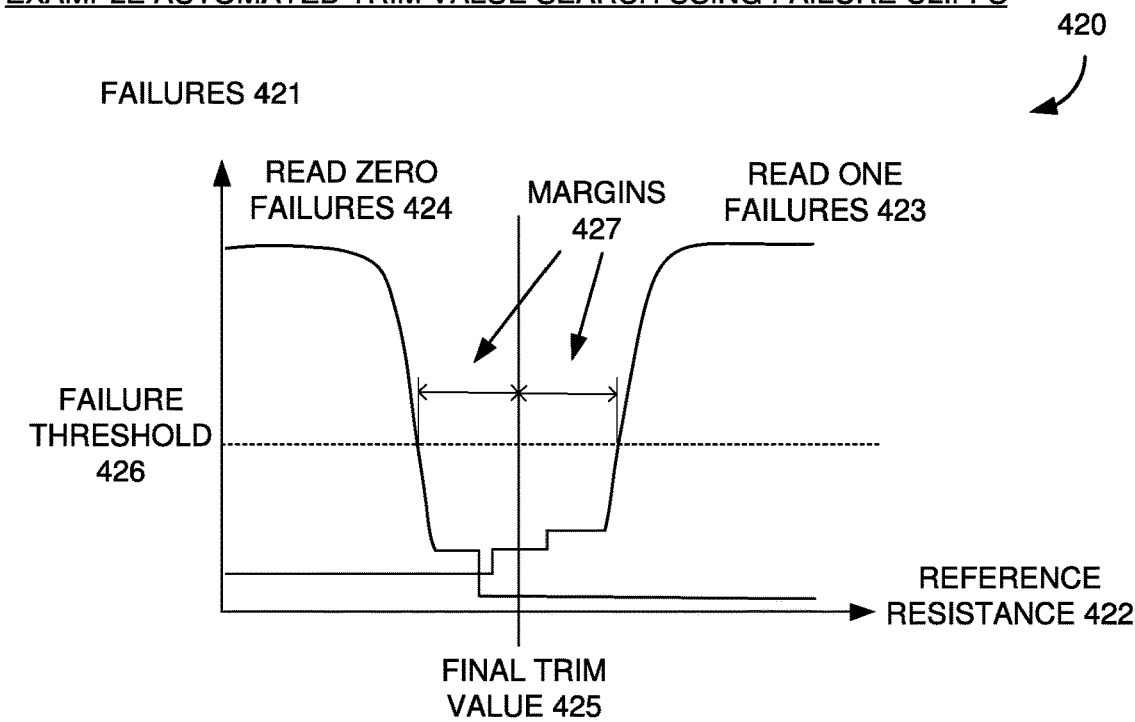

FIGS. 4B and 4C illustrate graphs of example trim reference selection results using different failure thresholds according to various embodiments. Referring to FIG. 4B, the graph 410 has an x-axis corresponding to reference resistances 412 used by magnetoresistive memory device during read operations and has a y-axis corresponding to accumulated failures 411 of read operations using the various reference resistances 412. The reference resistances 412 can correspond to an initial reference resistance combined with various reference trim values.

In this example, the graph 410 shows read zero failures 414 and read one failures 413. The read zero failures 414 can correspond to a number of accumulated failures of the memory device to correctly read a data value of "0" using the various reference resistances. The read zero failures 414 show a high number of failures when closer to a smaller reference trim value, and a low number of failures when closer to a large reference trim value. The read one failures 413 can correspond to a number of accumulated failures of the memory device to correctly read a data value of "1" using the various reference resistances. The read one failures 413 show a low number of failures when closer to a smaller reference trim value, and a high number of failures when closer to a large reference trim value.

A trim feedback circuit implementing an automated trim value search using failure tails shown in FIG. 4B can set a failure threshold 416 to the failure tails corresponding to a low-level of failures for the read zero failures 414 and read one failures 413. In some embodiments, the read zero failures 414 can be a difference between the accumulated read zero failures 404 at the different reference resistances 402 shown in FIG. 4A and the accumulated read zero failures 404 at the maximum trim value 407 shown in FIG. 4A. The read one failures 413 can be a difference between the accumulated read one failures 403 404 at the different reference resistances 402 shown in FIG. 4A and the accumulated read one failures 403 at the minimum trim value 406 shown in FIG. 4A. In some embodiments, the trim feedback circuit can determine fail bit count while reading data values of "0" from a memory device using a maximum reference trim, for example, providing a small number of bit failures, and set the failure threshold 416 for data values of "0" to the fail bit count. The trim feedback circuit also can determine fail bit count while reading data values of "1" from the memory device using a minimum reference trim, for example, providing a small number of bit failures, and set the failure threshold 416 for data values of "1" to the fail bit count. The trim feedback circuit can perform the automated search for a final trim value 415 using the failure thresholds 416.

Referring to FIG. 4C, the graph 420 has an x-axis corresponding to reference resistances 422 used by magnetoresistive memory device during read operations and has a y-axis corresponding to accumulated failures 421 of read operations using the various reference resistances 422. The reference resistances 422 can correspond to an initial reference resistance combined with various reference trim values.

In this example, the graph 420 shows read zero failures 424 and read one failures 413. The read zero failures 424 can correspond to a number of accumulated failures of the memory device to correctly read a data value of "0" using the various reference resistances. The read zero failures 424 show a high number of failures when closer to a smaller reference trim value, and a low number of failures when closer to a large reference trim value. The read one failures 423 can correspond to a number of accumulated failures of the memory device to correctly read a data value of "1" using the various reference resistances. The read one failures 423 show a low number of failures when closer to a smaller reference trim value, and a high number of failures when closer to a large reference trim value.

A trim feedback circuit can implement an automated trim value search using failure cliffs shown in FIG. 4C. The trim feedback circuit can perform the automated search to identify boundary trim values, for example, where the read one failure count and the read zero failure count exceed a failure threshold 426. The failure threshold 426 can correspond to a level of failures capable of being repaired, for example, using redundant row-based repair and/or redundant column-based repair, or corrected, for example, using a read data correction with an error correction control (ECC) process. In some embodiments, the failure threshold 426 can be set by the trim feedback circuit, for example, in response to user input. The trim feedback circuit can utilize the boundary trim values to select a final trim value 425 for the magnetoresistive memory device. The final trim value 425 can be different than the final trim value 415 shown in FIG. 4B. The final trim value 415 in FIG. 4B can correspond to common low point of the read zero failures 414 and the read one failures 413, while the final trim value 425 can have larger margins 427 from the intersections of the failure threshold 426 with the read zero failures 424 and the read one failures 423.

Referring back to FIG. 3, the trim feedback circuit 300 can include a trim mask 330 to receive the trim failure result 321 from the comparator 320 and generate a trim bit value 331 based on the trim failure result 321. In some embodiments, the trim bit value 331 can correspond to a bit of a final reference trim value for either reading data with a value of "0" or data with a value of "1". For example, when performing a binary search for the reference trim value, the trim mask 330 can set the trim bit value 331 to a zero for a particular bit location in the reference trim when the trim failure result 321 corresponds to a failure or set the trim bit value 331 to a one for the particular bit location in the reference trim when the trim failure result 321 corresponds to a pass. Embodiments of the binary search will be described below in greater detail with reference to FIG. 5.

Figure 5:
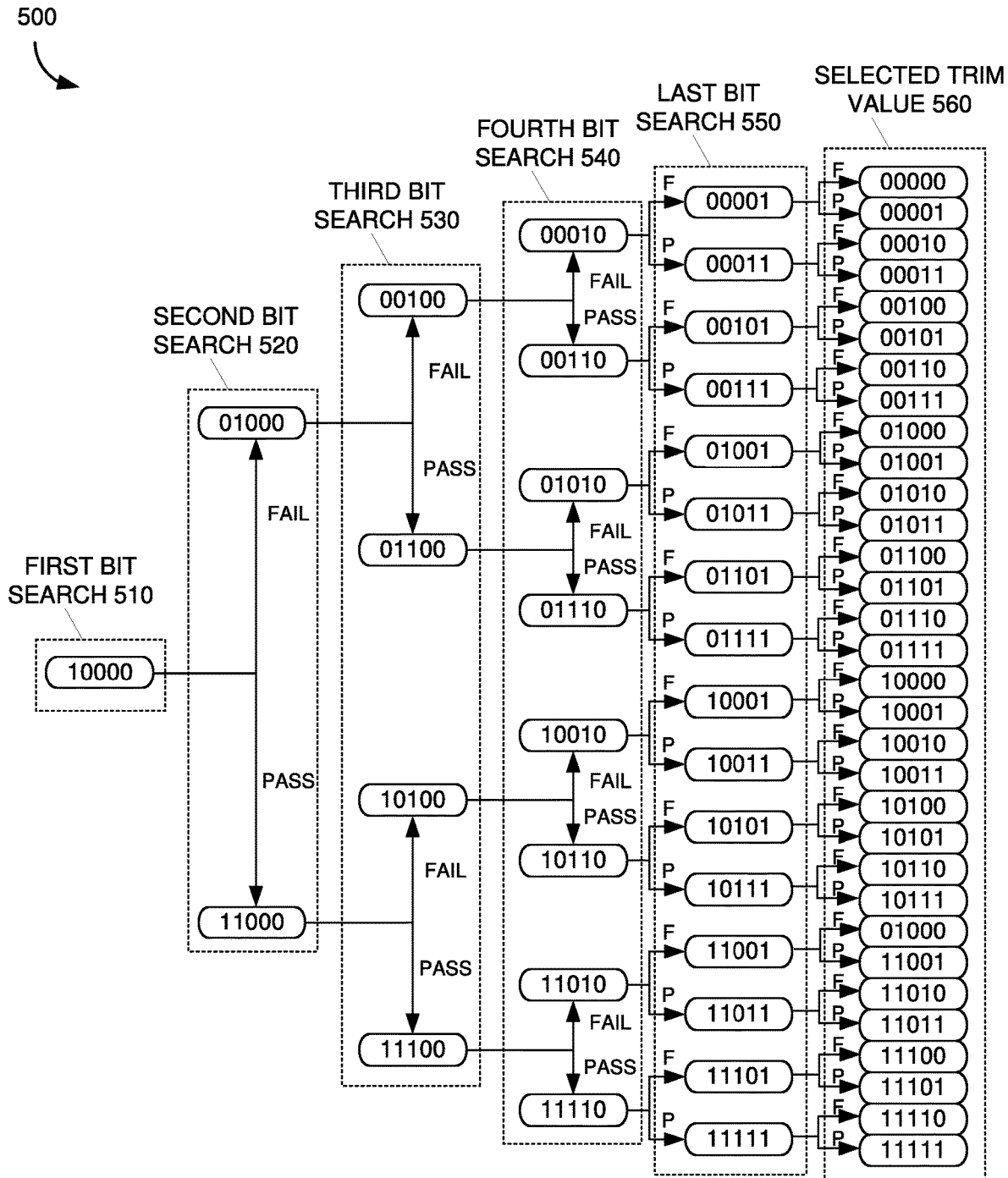
FIG. 5 illustrates a flowchart showing an example implementation of a binary search of trim reference values in an automated trim feedback process according to various embodiments.

FIG. 5 illustrates a flowchart showing an example implementation of a binary search 500 of trim reference values in an automated trim feedback process according to various embodiments. Referring to FIG. 5, the binary search 500 can start with a first bit search 510 of the automated trim feedback process that sets a reference trim value to "10000". The first bit search 510 of the automated trim feedback process can determine whether a number of read failures using the "10000" and compare those failures correspond to a pass or a fail relative to a failure threshold value.

In this example, when the first bit search 510 corresponds to a failure, a second bit search 520 sets a most significant bit of a next reference trim value to "0," sets the second most significant bit to "1", and sets the remaining bits to "0". When the first bit search 510 corresponds to a pass, the second bit search 520 sets a most significant bit of a next reference trim value to "1," sets the second most significant bit to "1", and sets the remaining bits to "0". The second bit search 520 of the automated trim feedback process can determine whether a number of read failures corresponds to a pass or a fail relative to a failure threshold value.

For a third bit search 530 of the automated trim feedback process, the reference trim can have the same value for the most significant bit as the second bit search 520. The automated trim feedback process can set the second most significant bit based on a pass or a failure during the second bit search 520, set the third most significant bit to "1", and set the remaining two bit to "0". The third bit search 530 of the automated trim feedback process can determine whether a number of read failures corresponds to a pass or a fail relative to a failure threshold value. Similar operations can be performed for the fourth bit search 540 and the last bit search 550, which can ultimately select a value for the reference trim as the selected trim value. The automated trim feedback process can iteratively perform multiple bit searches in order to identify the reference trim value for use by the memory device during read operations.

Referring back to FIG. 3, the trim feedback circuit 300 can include a selection circuit 340 to store the trim bit value 331 to the read zero boundary register 350 or the read one boundary register 360 based on the data type 303 being read from the memory device during the automated reference trim setting process. For example, when the automated trim feedback process stores data having a value of "0" to a memory device, the data type 303 can correspond to a zero data value, which can prompt the selection circuit 340 to store the trim bit value 331 from the trim mask 330 to the read zero boundary register 350. When the automated trim feedback process stores data having a value of "1" to the memory device, the data type 303 can correspond to a one data value, which can prompt the selection circuit 340 to store the trim bit value 331 from the trim mask 330 to the read one boundary register 360.

The automated trim feedback process can iterate with a new reference trim value being provided to the memory device and the trim feedback circuit 300 setting additional values of the read zero boundary register 350 or the read one boundary register 360, until reference trim values for reading data with a value of "0" and data with a value of "1" have been determined in the automated trim feedback process and stored in the read zero boundary register 350 and the read one boundary register 360, respectively.

The trim feedback circuit 300 can include a trim aggregator 370, which can merge the reference trim values from the read zero boundary register 350 and the read one boundary register 360 into an aggregate reference trim value. In some embodiments, the trim aggregator 370 can average, weighted average, combine, select between, aggregate, or the like, the reference trim values from the read zero boundary register 350 and the read one boundary register 360.

The trim feedback circuit 300 can include a selection circuit 380 to receive the aggregate reference trim value from the trim aggregator 370 and the trim bit value 331 from the trim mask 330. The selection circuit 380 can select between the aggregate reference trim value or the trim bit value 331 in response to a final trim signal 304, and output the selected value as a reference trim value 305. The trim feedback circuit 300 can include a trim register 390 to store the reference trim value 305 from the selection circuit 380, and provide the reference trim value 305 to the memory device for use during read operations.

Figure 6:
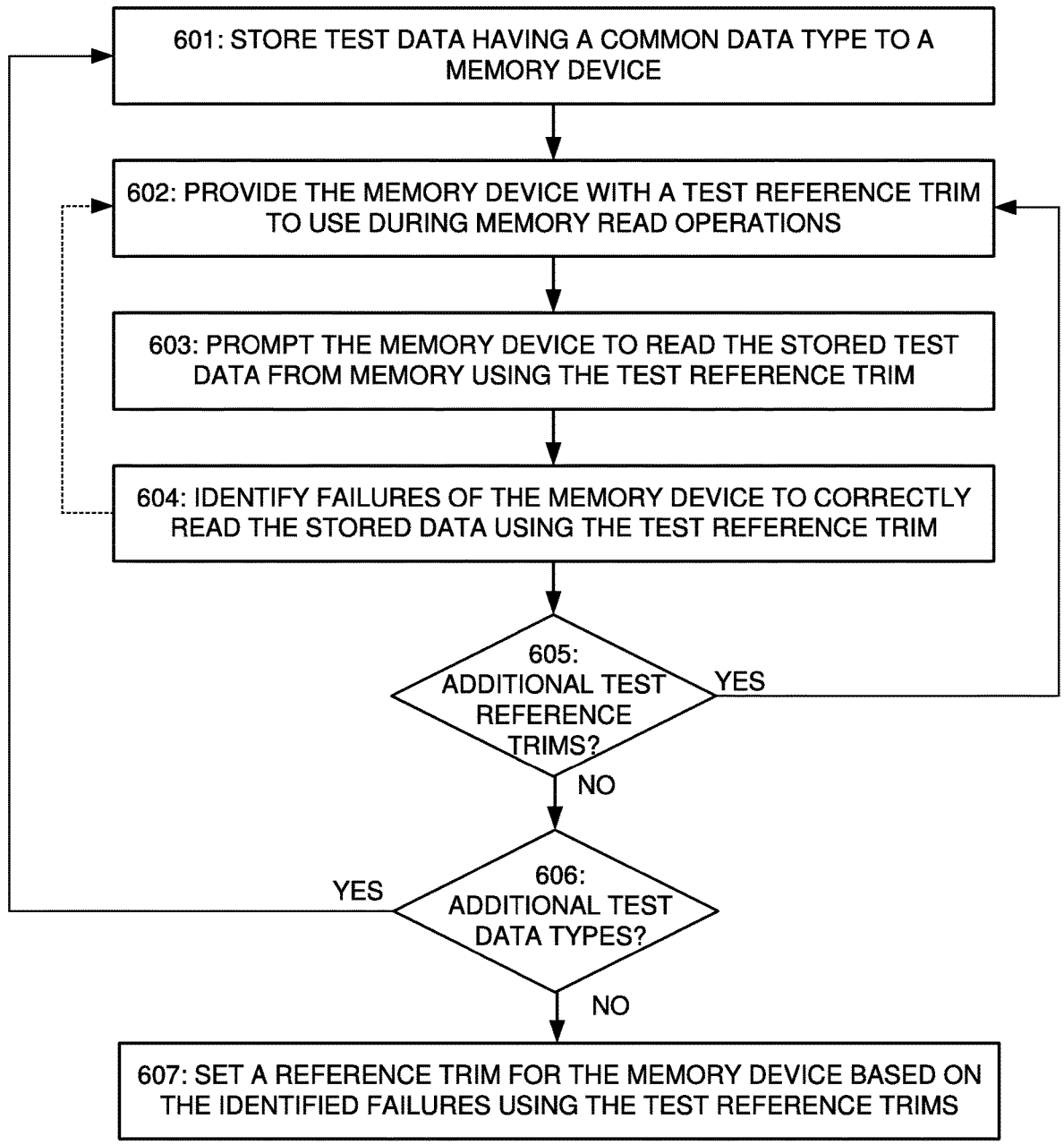
FIG. 6 illustrates a flowchart showing an example implementation of an automated trim feedback process according to various embodiments.

FIG. 6 illustrates a flowchart showing an example implementation of an automated trim feedback process according to various embodiments. Referring to FIG. 6, in block 601, a memory built-in self-test system can provide test data having a common data type to a memory device and prompt the memory device to store the test data. The memory built-in self-test system can write the test data to the memory device by generating a control signal to prompt the memory device to perform data write operations with the test data. In some embodiments, the memory built-in self-test system can write the same data value to memory cells in the memory device, such as all data "1" values or all data "0" values.

In block 602, the memory built-in self-test system can provide the memory device with a test reference trim to use during memory read operations. The memory built-in self-test system can be in a test initiate mode or a test boundary mode. The memory built-in self-test system, in the test initiate mode, can set the test reference trim value to a highest setting or a lowest setting based on the common data type stored in the memory device at the block 601. For example, when the common data type corresponds to a data level of "0", the memory built-in self-test system can set the test reference trim value to a highest setting. Conversely, when the common data type corresponds to a data level of "1", the memory built-in self-test system can set the test reference trim value to a lowest setting.

The memory built-in self-test system, in the test boundary mode, can select a value for the test reference trim based on a binary search process, for example, described above with reference FIG. 5. In some embodiments, the memory built-in self-test system can select the test reference trim value using a different technique or search method.

In block 603, the memory built-in self-test system can prompt the memory device to read the stored test data from memory using the test reference trim. The memory built-in self-test system can generate a control signal to prompt the memory device to perform data read operations. In response to the control signal, the memory device can sense the stored test data and compare the sensed data against a reference value to determine values for the stored test data. In some embodiments, the reference value can correspond to an initial reference value of the memory device, which has been adjusted based on the test reference trim.

In block 604, the memory built-in self-test system can identify failures of the memory device to correctly read the stored data using the test reference trim. The memory built-in self-test system can compare the data read from the memory device against the common data type of the stored data to determine whether the memory device correctly read the stored data using the test reference trim.

The memory built-in self-test system, in the test initiate mode, can accumulate the failures of the memory device to correctly read the stored data using the test reference trim and store them as a hard failure count for the common data type set in the block 601. Execution can return to the block 602, where the memory built-in self-test system can switch to the test boundary mode and select a test reference trim to be provided to the memory device.

The memory built-in self-test system, in the test boundary mode, can accumulate the failures of the memory device to correctly read the stored data using the test reference trim and then compare the accumulated failures against a baseline fail count, for example, read zero fail count at maximum reference trim setting or read one fail count as a minimum reference trim setting. By comparing the accumulated failures against the base line failure counts, the memory built-in self-test system can avoid the influence of hard failures in setting the reference trim value. In some embodiments, the memory built-in self-test system also can accumulate the failures and then compare the accumulated failures against a failure screen threshold to determine a failure result. The failure result, in some examples, can be utilized to set at least a portion of the reference trim for the common data type. By comparing the accumulated failures against the failure screen threshold, the memory built-in self-test system can avoid an influence of low statistical weak bit memory effect and determine a setting for the reference trim with wider read margin. In some embodiments, the memory built-in self-test system, in the test boundary mode, can utilize the results of the comparison to set at one bit of a boundary reference trim value for the common data type.

In block 605, the memory built-in self-test system can determine whether to perform the automated trim feedback process with at least one additional test reference trim. In some embodiments, the search process can include a particular number of iterative searches, with each search using a new test reference trim based, in part, on the failure result of a previous search. When the memory built-in self-test system, in the block 604, partially sets bits of the boundary reference trim value for the common data type, the memory built-in self-test system, in the block 605, can determine whether to perform another search when the boundary reference trim value has not been completely set yet. When another search is to be performed with at least one additional test reference trim, execution can return to the block 602; otherwise execution can proceed to block 606.

In the block 606, the memory built-in self-test system can determine whether to perform the automated trim feedback process with additional test data types. In some embodiments, the memory built-in self-test system can perform the automated trim feedback process with multiple different data types, such as values of "0" and "1", and possibly with one or more other data types. When another search is to be performed with at least one additional data type, execution can return to the block 601; otherwise execution can proceed to block 607. When execution returns to the block 601, the memory built-in self-test system can switch from the test boundary mode to the test initiate mode for the new test data type to be stored to the memory device.

In the block 607, the memory built-in self-test system can set a reference trim for the memory device based on the identified failures using the test reference trims. The memory built-in self-test system can set the reference trim by utilizing the failure results identified in the block 604, for example, to use the values of fail boundary reference trim for each data type, and then aggregating or averaging the fail boundary reference trims for each data type into a final reference trim value. In some embodiments, the memory built-in self-test system can provide the final reference trim value to the memory device for use in subsequent memory read operations.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system comprising:
 a memory device configured to sense values of stored data using a reference trim during memory read operations; and
 a memory built-in self-test system configured to prompt the memory device to perform a plurality of the memory read operations with multiple test values for the reference trim, determine when the memory device fails to correctly sense the values of the stored data using the test values for the reference trim by comparing the sensed values of the stored data against an expected value to identify the failures, accumulate the failures of the memory device to correctly sense the stored data, compare the accumulated failures to a threshold failure quantity corresponding to an accumulation of memory device failures when using a boundary test value for the reference trim, and set bits of the reference trim for the memory device based, at least in part, on comparisons of the accumulated failures to the threshold failure quantity.

2. The system of claim 1, wherein the memory built-in self-test system is configured to iteratively select the test values for the reference trim using a binary search based, at least in part, on the failures of the memory device to correctly sense the stored data.

3. The system of claim 1, wherein the test values correspond to at least one of resistance values, current values, or voltage values.

4. The system of claim 1, wherein the memory device is a Magnetoresistive Random Access Memory (MRAM) device.

5. A method comprising:
 sensing, by a memory device, values of stored data using multiple test values for a reference trim during memory read operations, determining, by a memory built-in self-test system, when the memory device fails to correctly sense the values of the stored data using the test values for the reference trim by comparing the sensed values of the stored data against an expected value to identify the failures;

accumulating, by the memory built-in self-test system, the failures of the memory device to correctly sense the stored data;

comparing, by the memory built-in self-test system, the accumulated failures to a threshold failure quantity corresponding to an accumulation of memory device failures when using a boundary test value for the reference trim; and setting, by the memory built-in self-test system, bits of the reference trim based, at least in part, on the;

setting, by the memory built-in self-test system, bits of the reference trim for the memory device based, at least in part, on the comparisons of the accumulated failures to the threshold failure quantity.

6. The method of claim 5, further comprising iteratively selecting, by the memory built-in self-test system, the test values for the reference trim using a binary search based, at least in part, on the failures of the memory device to correctly sense the stored data.

7. The method of claim 5, wherein the test values correspond to at least one of resistance values, current values, or voltage values.

8. The method of claim 5, wherein the memory device is a Magnetoresistive Random Access Memory (MRAM) device.

9. An apparatus comprising:
a memory built-in self-test controller configured to prompt a memory device to perform memory read operations with multiple test values for a reference trim, wherein the memory device is configured to sense values of stored data using the reference trim during the memory read operations; and a trim feedback circuit configured to determine when the memory device fails to correctly sense the values of the stored data using the test values for the reference trim by comparing the sensed values of the stored data against an expected value to identify the failures, accumulate the failures of the memory device to correctly sense the stored data, compare the accumulated failures to a threshold failure Quantity corresponding to an accumulation of memory device failures when using a boundary test value for the reference trim, and set bits of the reference trim for the memory device based, at least in part, on the failures of the memory device to correctly sense the stored data.

10. The apparatus of claim 9, wherein the trim feedback circuit is configured to iteratively select the test values for the reference trim using a binary search based, at least in part, on the failures of the memory device to correctly sense the stored data.

11. The apparatus of claim 9, wherein the test values correspond to at least one of resistance values, current values, or voltage values.

* * * * *